US010340926B2

(12) United States Patent
Chillara et al.

(10) Patent No.: US 10,340,926 B2
(45) Date of Patent: Jul. 2, 2019

(54) FAST SETTLING SAWTOOTH RAMP GENERATION IN A PHASE-LOCKED LOOP

(71) Applicant: Analog Devices Global, Hamilton (BM)

(72) Inventors: Vamshi Krishna Chillara, Limerick (IE); Declan M. Dalton, Ballyneety (IE); Pablo Cruz Dato, Valencia (ES)

(73) Assignee: Analog Devices Global, Hamilton (BM)

( * ) Notice: Subject to any disclaimer, the term of this patent is extended or adjusted under 35 U.S.C. 154(b) by 161 days.

(21) Appl. No.: 15/284,190

(22) Filed: Oct. 3, 2016

(65) Prior Publication Data
US 2018/0097522 A1 Apr. 5, 2018

(51) Int. Cl.
| H03L 7/00 | (2006.01) |
| H03L 7/093 | (2006.01) |
| H03K 4/90 | (2006.01) |
| H03L 7/099 | (2006.01) |
| H03L 7/10 | (2006.01) |
| H03L 7/107 | (2006.01) |
| H03L 7/12 | (2006.01) |
| H03K 3/80 | (2006.01) |

(52) U.S. Cl.
CPC .............. *H03L 7/093* (2013.01); *H03K 3/80* (2013.01); *H03K 4/90* (2013.01); *H03L 7/0991* (2013.01); *H03L 7/104* (2013.01); *H03L 7/107* (2013.01); *H03L 7/12* (2013.01); *H03L 2207/06* (2013.01)

(58) Field of Classification Search
CPC ....... H03L 7/093; H03L 7/0991; H03L 7/104; H03L 7/107; H03L 7/12; H03L 2207/06; H03K 4/90; H03K 3/80

USPC ..................................................... 331/1 A, 25
See application file for complete search history.

(56) References Cited

U.S. PATENT DOCUMENTS

| 4,757,279 A * | 7/1988 | Balzano ................... H03L 7/12 331/17 |
| 7,369,002 B2 | 5/2008 | Spijker et al. |
| 2005/0111605 A1 | 5/2005 | Loke et al. |
| 2007/0024383 A1 | 2/2007 | Spijker et al. |

(Continued)

FOREIGN PATENT DOCUMENTS

EP 2 237 418 10/2010

OTHER PUBLICATIONS

Takinami, K., et al., "A Distributed Oscillator Based All-Digital PLL With a 32-Phase Embedded Phase-to-Digital Converter," IEEE Journal of Solid-State Circuits, vol. 46, No. 11, Nov. 2011, pp. 2650-2660.

(Continued)

*Primary Examiner* — Richard Tan
(74) *Attorney, Agent, or Firm* — Knobbe, Martens, Olson & Bear, LLP

(57) ABSTRACT

Aspects of this disclosure relate to reducing settling time of a sawtooth ramp signal in a phase-locked loop. Information from a loop filter of the phase-locked loop can be stored and used within the loop filter so as to improve the settling time of the sawtooth ramp signal. In certain embodiments, the settling time of a periodic sawtooth ramp signal can be reduced to less than one microsecond. An output frequency at the end of the sawtooth chirp can be brought back to an initial value without significantly modifying phase error in disclosed embodiments.

20 Claims, 7 Drawing Sheets

(56) References Cited

U.S. PATENT DOCUMENTS

| | | | |
|---|---|---|---|
| 2011/0148530 A1* | 6/2011 | Geltinger | H03L 7/099 331/18 |
| 2014/0085012 A1 | 3/2014 | Wu et al. | |
| 2015/0288371 A1 | 10/2015 | Prummel | |
| 2017/0012631 A1 | 1/2017 | Dato et al. | |

OTHER PUBLICATIONS

Temporiti, et al., "A 3 GHz Fractional All-Digital PLL With a 1.8 MHz Bandwidth Implementing Spur Reduction Techniques," IEEE Journal of Solid-State Circuits, vol. 44, No. 3, Mar. 2009, pp. 824-834.

Texas Instruments, "LMX2492/LMX2492-Q1 14 GHz Low Noise Fractional N PLL with Ramp/Chirp Generation," revised May 2015, 42 pages, available at: http://www.ti.com/lit/ds/symlink/lmx2492-q1.pdf (accessed Jan. 11, 2017).

Thurn, K., et al., "A Novel Interlaced Chirp Sequence Radar Concept with Range-Doppler Processing for Automotive Applications," IEEE MMT-S International Microwave Symposium Digest, May 2015, 4 pages.

Velner, J., et al., "A Multi-Band, High Bandwidth, Short Duration Linear Chirp Generation IC for Phased-Array Applications," 2013 IEEE International Symposium on Phased Array Systems & Technology, Oct. 2013, 4 pages.

Wu, et al., "A mm-Wave FMCW Radar Transmitter Based on a Multirate ADPLL," 2013 IEEE Radio Frequency Integrated Circuits Symposium, Jun. 2013, pp. 107-110.

Wu, Wanghua, "Millimeter-Wave Digitally-Assisted Frequency Synthesizer in CMOS," Doctoral Thesis, Delft University of Technology, 2013.

Staszewski, et al., "All Digital PLL With Ultra Fast Settling," IEEE Transaction on Circuits and Systems—II: Express Briefs, vol. 54, No. 2, Feb. 2007.

Bengtsson, Lars E., "Implementation of high-resolution time-to-digital converter in 8-bit microcontrollers," Review of Scientific Instruments, vol. 83, Apr. 5, 2012.

German Office Action dated Jul. 24, 2018 for German Patent Application No. 102017122871.3, 8 pages.

* cited by examiner

US 10,340,926 B2

FAST SETTLING SAWTOOTH RAMP GENERATION IN A PHASE-LOCKED LOOP

FIELD OF DISCLOSURE

The disclosed technology relates to phase-locked loops.

BACKGROUND

A chirp signal or chirp can refer to a frequency modulated (FM) signal. A chirp signal can be used in radar applications, such as determining an object's range. A chirp signal has a frequency that varies over a fixed period of time. When a desired frequency as a function of time takes on a sawtooth ramp, it can be referred to as a sawtooth chirp. A sawtooth chirp may be generated using a ramp generator and/or in a phase-locked loop.

Phase-locked loops (PLLs) are closed loop systems for locking the phase of a reference signal with an oscillator. A PLL can be designed to have a specific type (e.g., type-I, type-II, or higher) and a specific order (e.g., $1^{st}$ order, $2^{nd}$ order, or higher). In system theory, the type can refer to the number of integrators within the loop and the order can refer to the degree of the denominator in the PLL system transfer function. Both the order and the type can impact functionality of a PLL suitable for reliably generating sawtooth ramps.

SUMMARY OF THE DISCLOSURE

The innovations described in the claims each have several aspects, no single one of which is solely responsible for the desirable attributes. Without limiting the scope of the claims, some prominent features of this disclosure will now be briefly described.

One aspect of this disclosure is a phase-locked loop comprising a loop filter and an oscillator. The loop filter is configured to provide a sawtooth ramp signal that has a settling time of less than 1 microsecond. The oscillator is coupled to the loop filter and is configured to generate an oscillating signal based on the sawtooth ramp signal.

The oscillator can be a digitally controlled oscillator, and the sawtooth ramp signal can represent an oscillator tuning word.

The phase-locked loop can further comprise a time-to-digital converter coupled in a feedback path between an output of the oscillator and an input of the loop filter. The phase-locked loop can be a type II phase-locked loop.

The loop filter can comprise a proportional path and a sampling circuit. The sampling circuit can be configured to sample a value from the proportional path. The sawtooth ramp signal can be based on an output of the proportional path and an output of the sampling circuit. The loop filter can further comprise an integral path, and the sawtooth ramp signal can be based on an output of the integral path. The integral path can be configured to reset responsive to a signal indicating a new chirp of the sawtooth ramp signal. The loop filter further can also comprise another proportional path that is inactive after the phase-locked loop is locked.

A radar device can comprise the phase-locked loop.

In another aspect, a phase-locked loop comprises a loop filter and an oscillator. The loop filter comprises a proportional path and a sampling circuit. The sampling circuit is configured to sample a value from the proportional path. The loop filter is configured to provide a sawtooth ramp signal based on an output of the sampling circuit and an output of the proportional path. The oscillator is coupled to the loop filter and configured to generate an oscillating signal based on the sawtooth ramp signal.

The loop filter can be configured to bring the sawtooth ramp signal to an initial value in association with an end of a chirp to thereby reduce settling time of the sawtooth ramp signal.

The sampling circuit can be configured to sample the value from the proportional path responsive to a signal indicating a new chirp of the sawtooth ramp signal.

The loop filter can further comprise an integral path including an accumulator. The accumulator can be configured to reset responsive a signal indicating a new chirp of the sawtooth ramp.

The loop filter can comprise a summer. The summer can be configured to subtract the output of the sampling circuit from a value that includes the output of the proportional path to generate the sawtooth ramp signal. The sawtooth ramp signal can have a settling time of less than 100 cycles of a reference clock signal provided to the phase-locked loop.

The loop filter can further comprise another proportional path configured to be active during an acquisition mode of the phase locked loop.

The oscillator can comprise a digitally controlled oscillator, and the sawtooth ramp signal can be an output tuning word for the digitally controlled oscillator.

In another aspect a method of generating a sawtooth ramp signal in a phase-locked loop comprises sampling a signal from a loop filter of the phase-locked loop and adjusting an output of the loop filter. The output of the loop filter is adjusted based on a value from said sampling such that the output of the loop filter is a sawtooth ramp signal with a reduced settling time.

The method can further comprise resetting an accumulator of the loop filter responsive to a chirp start signal indicating a start of a chirp of the sawtooth ramp.

The said adjusting can bring the output of the loop filter to an initial value in association with an end of a chirp.

The sawtooth ramp signal can have a settling time of less than 1 microsecond.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION

Figure 1:
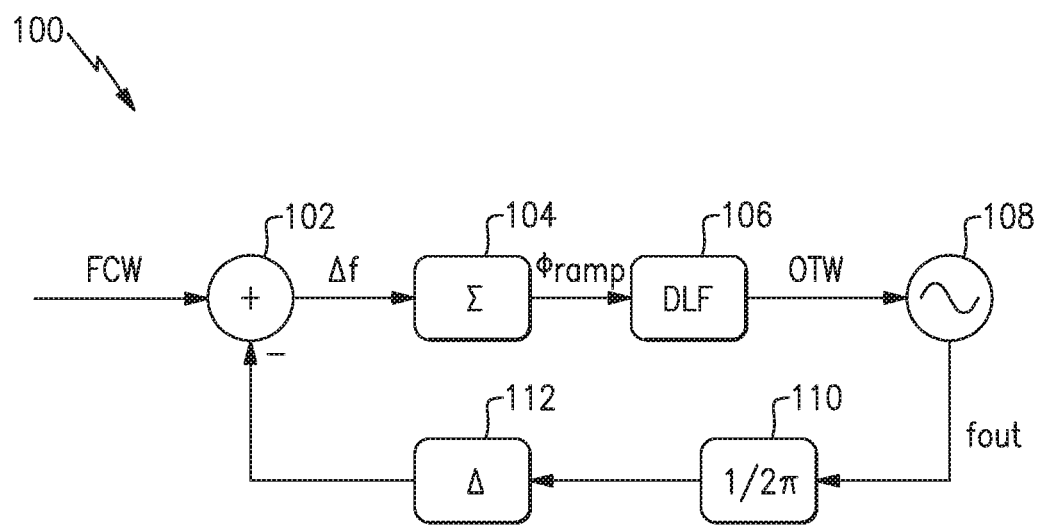
FIG. 1 is a system diagram of a digital phase-locked loop (DPLL) that includes a digital loop filter (DLF) according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A digital phase-locked loop (DPLL) can be an attractive alternative to traditional analog charge-pump phase-locked loops (CP-PLLs) for frequency synthesis in advanced complementary metal oxide semiconductor (CMOS) technologies. While CP-PLLs are still widely used, DPLLs offer advantages more easily realized in the digital domain. These advantages can include enhanced performance and/or speed. DPLLs can also be implemented with a reduction in size and/or cost relative to CP-PLLs. For instance, a CP-PLL typically uses a voltage-controlled oscillator, which can be sensitive to temperature and to power supply variations, while a DPLL can be designed to be substantially immune to its environment and power supply.

A sawtooth ramp, also known as a sawtooth chirp or as a "chirp," is a signal having a frequency that ramps linearly in time and is periodic. An example sawtooth ramp will be discussed with reference to FIG. 2. The sawtooth ramp includes a ramping section, in which the signal's frequency ramps linearly with time to its maximum frequency. The sawtooth ramp also includes a fast transition section, in which the waveform rapidly resets from its maximum frequency to its minimum or initial frequency. The bandwidth of a sawtooth ramp signal can be defined as the range of frequencies between the minimum and maximum frequency. During rapid transitions from maximum to minimum frequency, there can be a frequency overshoot and/or undershoot due to the properties of the DPLL. For instance, the type and/or order of the DPLL can determine the loop response time. The loop response time, in turn, can affect how long it takes to establish lock to the correct frequency value with little or no frequency error. Thus, the settling time and frequency error can be significant performance criteria. Accordingly, there is a need to develop a DPLL which can generate sawtooth ramps with fast settling times.

Provided herein are apparatus and methods for fast settling sawtooth ramp generation in digital phase-locked loops. A method to improve the settling time of the sawtooth ramps generated by a digital phase locked loop (DPLL) is described. Sawtooth ramps can have a periodic waveform that includes a ramping portion and a fast reset transition portion in which the sawtooth ramp is reset to its starting value. The output frequency at the end of the sawtooth ramp can be brought back to the initial value without significantly modifying the phase error. This can advantageously take advantage of features of the digital implementation of a DPLL. The DPLL can sample digital information on a ramping portion of the waveform prior to the end of the saw-tooth ramp and then use the sampled information to determine an accurate value of the waveform. This can greatly reduce the settling time between sawtooth ramps.

In an embodiment, a phase-locked loop includes a loop filter and an oscillator. The loop filter can provide a sawtooth ramp signal, in which the sawtooth ramp signal has a fast settling time. The settling time can be less than 1 microsecond. In some instances, the settling time can be less than 0.5 microseconds. Alternatively or additionally, the settling time can be less than about 100 cycles of a reference clock signal provided to the phase-locked loop that includes the loop filter. For instance, when the reference clock frequency is 100 MHz, the settling time can be less than 1 microsecond and less than about 100 reference clock cycles. In some instances, the settling time can be less than 50 cycles of the reference clock signal. The oscillator can generate an oscillating signal based on the sawtooth ramp signal. The oscillator can be a digitally controlled oscillator, for example. The loop filter can be a digital loop filter, for example. The loop filter can include a proportional path and a sampling circuit arranged to sample a value from the proportional path. The sampled value from the proportional path can adjust the output of the loop filter to thereby reduce the settling time of the sawtooth ramp signal. The loop filter can also include an integral path that includes an accumulator configured to reset in association with the sawtooth ramp signal beginning to ramp in frequency.

FIG. 1 is a system diagram of a digital phase-locked loop (DPLL) 100 that includes a digital loop filter (DLF) 106 according to one embodiment. In addition to the DLF 106, the illustrated DPLL 100 includes a summer 102, an accumulator 104, a digitally controlled oscillator (DCO) 108, a time-to-digital converter (TDC)/counter 110, and a differentiation block 112. A frequency command word FCW is provided at an input of the summer 102. The frequency command word FCW provides digital data that the DPLL 100 uses to generate an output signal having an output frequency $f_{out}$.

The DPLL 100 can be a type-II DPLL that includes a time-to-digital converter (TDC) and counter. The TDC/counter can convert the output phase in radians to a decimal number normalized to the DCO clock period. Accordingly, the illustrated TDC/counter 110 is labeled as $1/2\pi$ to represent its transfer function. This output normalized phase is then differentiated (in digital domain) by the differentiation block 112 to generate the digitized output frequency for a phase detector. As illustrated in FIG. 1, the phase detector can be implemented by the summer 102 and the accumulator 104.

The TDC/counter 110 and differentiation block 112 can represent and model the system-level return path in a DPLL. An output of the differentiation block 112 is provided to the summer 102. The summer 102 can subtract the output of the differentiation block 112 from the frequency command word FCW in the digital domain to provide a difference Δf. The difference Δf can be applied to the accumulator 104. In the system of FIG. 1, the summer 102 and accumulator 104 can be a phase detector realized in the digital domain.

In FIG. 1, the output of accumulator 104 is a phase error. When the DPLL 100 is in the process of generating a ramp signal, the phase error can have a non-zero value that can be constant. The phase error $\Phi_{ramp}$ of FIG. 1 represents the phase error while the DPLL 100 is generating a sawtooth ramp signal in the frequency domain as a function of time.

The phase error signal $\Phi_{ramp}$ can be represented by a digital word in the DPLL 100. In the teachings herein, a sawtooth ramp can also be referred to as a sawtooth ramp signal, a sawtooth chirp, or a "chirp".

The phase error $\Phi_{ramp}$ is provided to the input of the DLF 106. The DLF 106 performs digital filtering operations to provide an oscillator tuning word OTW. The oscillator tuning word OTW is provided to the input of the DCO 108, which, in turn, provides the output signal having output frequency $f_{out}$. A goal of the DPLL is to lock the output frequency $f_{out}$ to the frequency command word FCW so that a frequency error $\Delta f$ reduces to zero or almost zero.

As shown in the schematic block diagram of the DPLL 100 of FIG. 1, the input of the DPLL 100 receives the frequency command word FCW. The frequency command word FCW is an input to the DPLL 100 from which an output clock signal of the DPLL 100 is generated. The output of the differentiation block 112 can be subtracted from the frequency command word FCW to provide the frequency error $\Delta f$, which is integrated to generate the phase error $\Phi_{ramp}$. This phase error $\Phi_{ramp}$, after being filtered by the digital loop filter DLF 106, controls the DCO 108 to generate the desired output frequency $f_{out}$. An expression for the output frequency $f_{out}$ can be given by Equation 1 in terms of a reference clock frequency $f_{ref}$.

$$f_{out} = FCW \cdot f_{ref} \qquad \text{Eq. 1}$$

When the frequency command word FCW is a digital representation of a signal having sharp or rapid transitions, there can be a transient recovery time due to system response time. Teachings related to the DLF 106 can compensate for inaccuracies of the OTW following a rapid transition in the frequency control word FCW.

Figure 2:
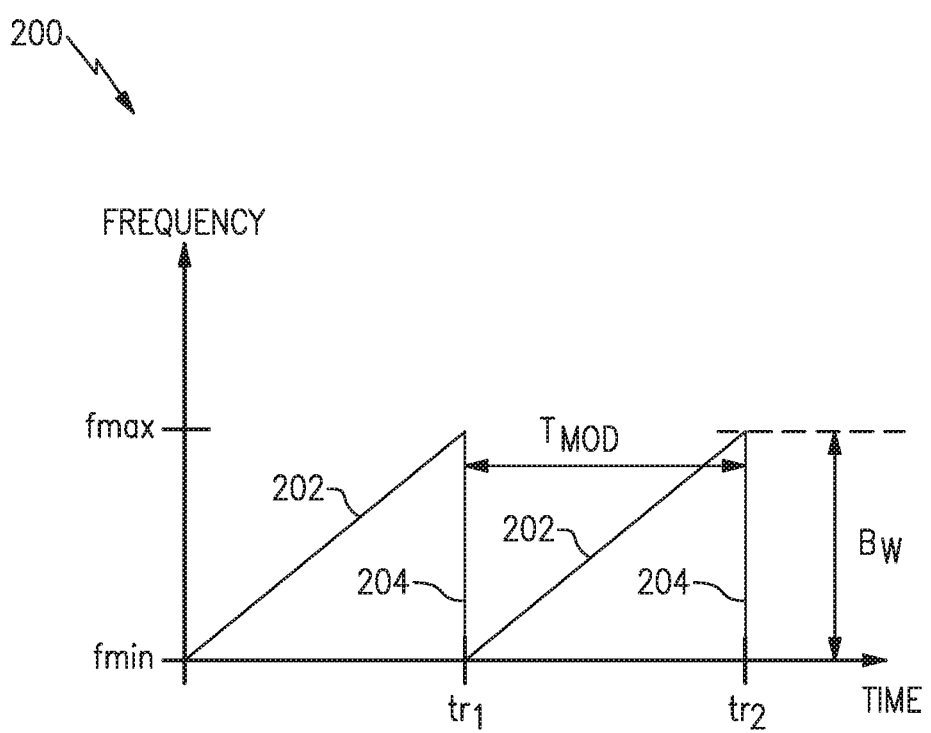
FIG. 2 shows a plot of a frequency versus time of a sawtooth ramp associated with a DPLL.

FIG. 2 shows a plot 200 of frequency versus time of a sawtooth ramp for associated with with the DPLL 100. As shown in FIG. 2 the sawtooth ramp is periodic with period $T_{mod}$. Each sawtooth ramp has a ramping portion 202 and a sharp transition portion 204. The ramping portion of the sawtooth ramp can be determined by a periodic piecewise linear relationship for a time t between 0 and $T_{mod}$.

The sharp transition portion 204 represents a part of the sawtooth ramp where the sawtooth is reset from its maximum frequency $f_{max}$ to its lowest frequency value $f_{min}$. The sharp transition 204 is shown to occur at times $t_{r1}$ and $t_{r2}$ that are separated in time by the period $T_{mod}$. As shown in FIG. 2, the signal bandwidth BW is the difference of the maximum frequency $f_{max}$ and the minimum frequency $f_{min}$. At the times $t_{r1}$ and $t_{r2}$ where the sawtooth ramp is reset, a large frequency error $\Delta f$ can occur while a DPLL is in a transient state.

This transient duration can be a significant portion of the chirp duration while generating fast ramps that are used in range Doppler analysis. As taught herein, a DPLL 100 including a DLF 106 that compensates for transient errors can improve the settling time. Further, the teachings herein can apply to other chirp waveforms that include a fast transition portion similar to the fast transition portion 204 of FIG. 2. While FIG. 2 shows a sawtooth ramp signal that has a ramp that increases in frequency, any suitable principles and advantages discussed herein can be applied to sawtooth ramp signals that decrease in frequency and then have a sharp transition. Although FIG. 2 shows a plot 200 of an example sawtooth ramp, the teachings herein can be applied to the generation of other periodic frequency signals or waveforms where there is a ramping portion, such as the ramping portion 202, but where the ramping portion increases or decreases linearly over a known bandwidth BW.

During the ramping portion, the DPLL 100 can acquire lock to a steady state condition so that digital information within a DLF 106 can be used to correct for transient errors following the fast transition portion.

Figure 3:
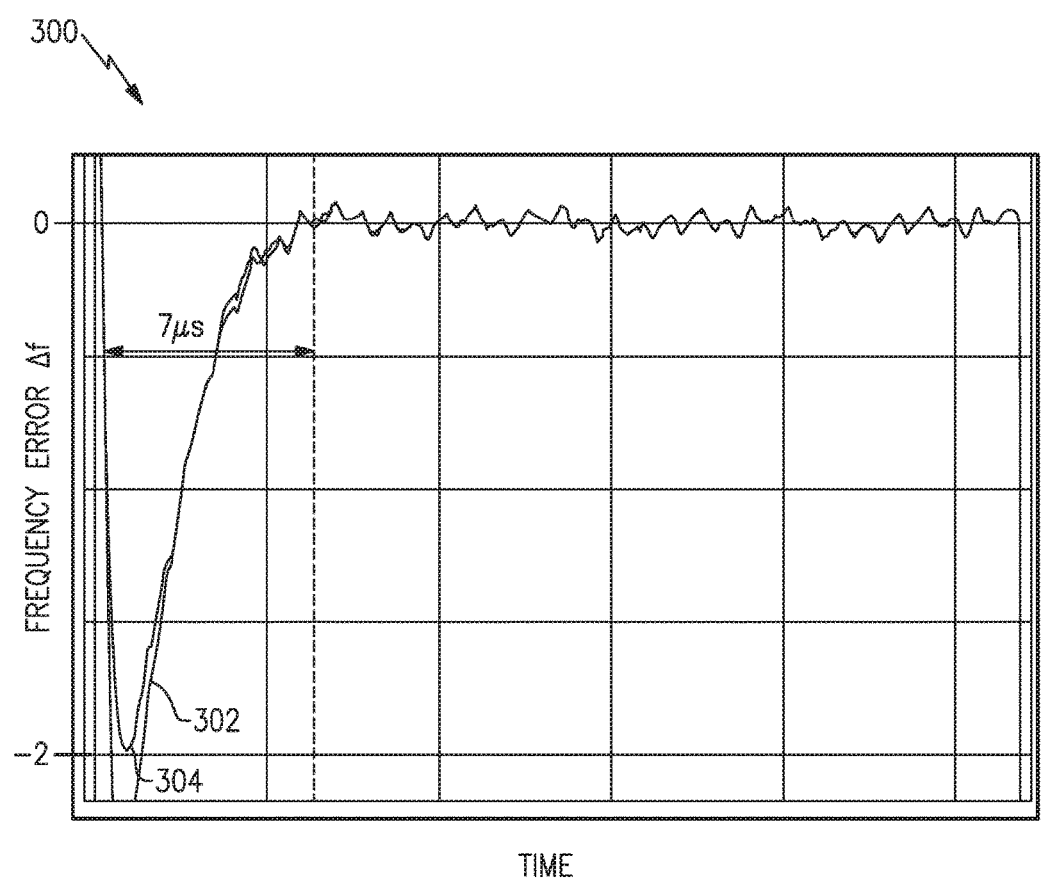
FIG. 3 shows a plot of frequency error as a function of time for measured sawtooth ramps having settling time errors.

FIG. 3 shows a plot 300 of frequency error $\Delta f$ as a function of time for measured sawtooth ramps 302 and 304 having relatively large settling time errors. As shown in FIG. 3, the settling time errors can be approximately 7 microseconds in duration, when a DPLL does not include compensation. A relatively long settling time can limit the useful duration of the generated ramp.

A PLL is prone to the settling time errors illustrated in FIG. 3 when it is configured in type-II mode, a mode commonly used for generating ramps. When a type-II PLL is locked to a single frequency, its phase error can approach a steady state value around zero. On the other hand, when locking to a sawtooth ramp or similar frequency ramping signal, the phase error $\Phi_{ramp}$ can reach a constant non-zero steady-state value that is a function of several parameters including the slope of the generated ramp and the loop-filter coefficients. For instance, the phase error $\Phi_{ramp}$ can be a function of a ramp slope A Hz/s and an integral coefficient of the proportional-integral (PI) filter $\rho$. Thus, the steepness and/or slope of the ramp, as well as the DPLL type (e.g. type-II) and properties of the loop filter, can be factors in determining how the DPLL locks to a steady-state value of the phase error $\Phi_{ramp}$.

The relatively large settling time of approximately 7 microseconds (us) as observed in FIG. 3 can be the result of a DPLL trying to acquire a phase error $\Phi_{ramp}$ starting from an initial value of zero.

In a typical scenario, the loop filter coefficients and the reference clock frequency of the DPLL are fixed. Thus, the phase error $\Phi_{ramp}$ that the DPLL acquires remains unchanged from one sawtooth ramp to the next, provided that the slope of the generated ramps is constant and the oscillator gain is estimated correctly and/or does not vary. This suggests that by changing the DPLL frequency at the start of each chirp without disturbing the acquired phase error, the settling time on subsequent chirps can be greatly reduced.

Figure 4:
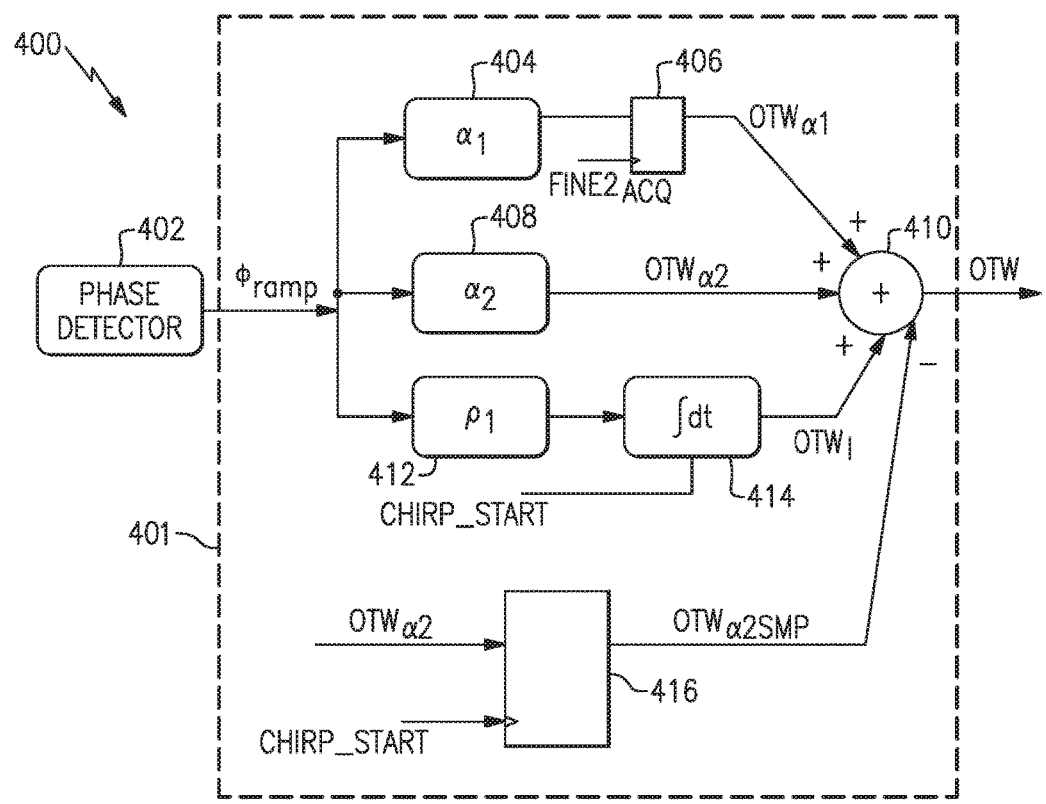
FIG. 4 shows a schematic block diagram of a portion of a DPLL that includes a DLF according to an embodiment.

FIG. 4 shows a schematic block diagram 400 of a portion of a DPLL that includes a DLF 401 according to an embodiment. The DLF 401 is an example of the DLF 106 of FIG. 1. Accordingly, the DLF 401 can be implemented in the DPLL 100, for example. The illustrated DLF 401 receives the phase error $\Phi_{ramp}$ from a phase detector 402 and generates the oscillator tuning word OTW for a DCO, such as the DCO 108 of FIG. 1. The DLF 401 includes a proportional block 404, a digital memory element 406, a proportional block 408, an integral coefficient block 412, an accumulator 414, a digital memory element 416, and a summer 410.

A first proportional path of the DLF 401 includes the proportional block 404 and the digital memory element 406. The proportional block 404 and the digital memory element 406 are connected between the phase detector 402 and the summer 410 to operate as a proportional filter path with proportional coefficient $\alpha_1$. As shown in FIG. 4, the proportional block 404 receives the phase error $\Phi_{ramp}$ and multiplies it by the proportional coefficient $\alpha_1$. The digital memory element 406 is controlled by a control signal $fine2_{acq}$ to provide a first output $OTW_{\alpha_1}$ to the summer 410. In certain embodiments, a DLF in accordance with any suitable principles and advantages discussed herein can be implemented without the proportional block 403 and the digital memory element 406.

A second proportional path of the DLF 401 includes the proportional block 408. As illustrated, the proportional block 408 is connected between the phase detector 402 and the summer 410 to operate as a proportional filter path with proportional coefficient $\alpha_2$. The proportional block 408 receives the phase error $\Phi_{ramp}$ and multiplies it by the proportional coefficient $\alpha_2$ to generate a second output $OTW_{\alpha_2}$. The second output $OTW_{\alpha_2}$ is provided by the proportion block 408 to the summer 410.

An integral path of the DLF 401 includes the integral coefficient block 412 and the accumulator 414. The integral coefficient block 412 and the accumulator 414 are connected between the phase detector 402 and the summer 410 to operate as an integral filter path with integral coefficient $\rho$. As shown in FIG. 4, the phase error is received by the integral coefficient block 412 and multiplied by the integral coefficient $\rho$. The output of the integral coefficient block, 412 is then integrated by the accumulator 414 to generate the integrated output $OTW_I$. The integrated output $OTW_I$ is provided by the accumulator 414 to the summer 410.

The proportional block 404 with the digital memory element 406 can be enabled when the DPLL 100 is out of lock and then frozen when the DPLL 100 is locked. The control signal $fine2_{acq}$ can control the digital memory element 406 to freeze or hold the value of the first output $OTW_{\alpha_1}$ once the DPLL 100 acquires lock. Thus, the first proportional path that includes the proportional block 404 may only be active during acquisition and the first output $OTW_{\alpha_1}$ can be frozen once the DPLL 100 is locked. The digital memory element 406 can be implemented using a flip-flop or other suitable state element to sample the output of the proportional block 404.

Once the DPLL 100 acquires lock, the first output $OTW_{\alpha_1}$ can be held fixed by the digital memory element 406 and filtering of the phase error $\Phi_{ramp}$ proceeds via the second proportional path and integral path that function as a proportional-integral (PI) filter. During this mode of operation, a portion of the oscillator tuning word OTW generated by the DLF 401 at the output of the summer 410 from the two proportional paths and the integral path can be represented by Equation 2.

$$OTW = OTW_{\alpha_1} + \alpha_2 \cdot \phi + \rho \int \phi \, dt. \quad \text{Eq. 2}$$

A sampling circuit can sample a value from a proportional path of the loop filter for use in improving settling time after a sharp transition of a sawtooth ramp signal. For instance, in the DLF 401, the digital memory element 416 is configured to sample a value $OTW_{\alpha_2}$ from the second proportional path of the DLF 401. The digital memory element 416 is configured to receive a ramp reset signal chirp_start. As discussed in more detail below, the digital memory element 416 and the ramp reset signal chirp_start can be used to advantageously adjust the oscillator tuning word OTW to improve the DPLL response time to sharp transitions in a sawtooth ramp.

A more detailed analysis will be provided, beginning with an analysis of the DLF 401 for a sawtooth ramp. When locked to a single frequency, the output of the phase detector 402 can be equal to or approximately equal to zero. Hence, the oscillator tuning word OTW at the start of the sawtooth ramp can be represented by Equation 3.

$$OTW_{start} = OTW_{\alpha_1} \quad \text{Eq. 3}$$

Equation 3 for the initial value $OTW_{start}$ of the oscillator tuning word OTW can correspond to a time zero in FIG. 2 where a DPLL has just acquired lock and the control signal $fine2_{acq}$ has locked the output of the digital memory element 404 to a fixed frequency as described above.

Next, the response of the proportional and integral paths of the DLF 401 during the ramping portion of the sawtooth ramp will be described. While the sawtooth ramp is ramping in frequency, the output of the phase detector gives a non-zero constant phase error $\Phi_{ramp}$. The non-zero phase error $\Phi_{ramp}$ at the input of the PI filter, which is defined by the proportion and integral paths of the DLF 401, results in a ramp at the output. Calculus dictates that the integration of a constant results in ramp. A portion of a ramp of the oscillator tuning word OTW, denoted by $OTW_{ramp}$, for a constant phase error $\Phi_{ramp}$ can be represented by Equation 4.

$$OTW_{ramp} = OTW_{\alpha_1} + \alpha_2 \cdot \phi_{ramp} + \rho \cdot \phi_{ramp} \cdot t \quad \text{Eq. 4}$$

Similar to Equation 2, Equation 4 shows the oscillator tuning word components due to the proportional block 406, to the proportional block 408, and to the integral coefficient block 412 with the accumulator 414. Equation 4, however, does not account for the influence of the digital memory element 416 on the output tuning word OTW.

For a sawtooth chirp with duration $T_{mod}$, a portion of the oscillator tuning word OTW at the end of the chirp can be represented by Equation 5.

$$OTW_{end} = OTW_{\alpha_1} + \alpha_2 \cdot \phi_{ramp} + \rho \cdot \phi_{ramp} \cdot T_{mod} \quad \text{Eq. 5}$$

Equation 5, which is derived from Equation 4, also shows the oscillator tuning word components due to the proportional block 406, to the proportional block 408, and to the integral coefficient block 412 with the accumulator 414. Equation 5, however, does not account for the influence of the digital memory element 416 on the output tuning word OTW.

The bandwidth BW, which is the difference between the maximum and minimum frequencies of the sawtooth ramp, can also be related to the difference of the oscillator tuning word OTW at the start and at the end of a chirp as represented by Equation 6.

$$BW = (\alpha_2 \cdot \phi_{ramp} + \rho \cdot \phi_{ramp} \cdot T_{mod}) * k_v \quad \text{Eq. 6}$$

Equation 6, which is derived from Equations 4 and 6, relates the bandwidth BW to the frequency difference $OTW_{end} - OTW_{start}$ by the oscillator gain $k_v$.

In order to reduce and/or minimize the settling time between successive chirps, the oscillator tuning word OTW at the beginning of the subsequent chirp can be changed instantaneously from the value $OTW_{end}$ to the value $OTW_{start}$ without disturbing the loop. This can be accomplished by using the digital memory element 416 and the ramp reset signal chirp_start as shown in FIG. 4. The oscillator tuning word integral part $OTW_I$ can be made zero by resetting the accumulator 414 at the start of the sawtooth ramp using the ramp reset signal chirp_start.

The proportional part $OTW_{\alpha_2}$ follows the phase error, which remains unchanged. Accordingly, as soon as the reset pulse chirp_start is disabled, the oscillator tuning word proportional part $OTW_{\alpha_2}$ reverts to its original value, thereby causing a disturbance in the loop. To compensate for the proportional part $OTW_{\alpha_2}$, the digital memory element 416, which can be a flip-flop, receives the oscillator tuning word proportional part $OTW_{\alpha_2}$ at its input and provides the sampled tuning word $OTW_{\alpha_2 SMP}$ to the summer 410. When the tuning word proportional part $OTW_{\alpha_2}$ is sampled at intervals set by the ramp reset signal chirp_start, summer 410 can subtract the sampled tuning word $OTW_{\alpha_2 SMP}$ so as to compensate for the disturbance in the loop described above.

Accordingly, the digital memory element 416 operates as a sampling circuit to sample the tuning word proportional part $OTW_{\alpha_2}$.

Thus, using the ramp reset signal chirp_start and the digital memory element, the oscillator tuning word OTW of Equation 2 can behave as represented by Equation 7:

$$OTW = OTW_{\alpha_1} + \alpha_2 \cdot \phi + \rho \int \phi \, dt - OTW_{\alpha_2 SMP} \qquad \text{Eq. 7}$$

In Equation 7, the sampled tuning word $OTW_{\alpha_2 SMP}$ is the sampled value of the proportional part of the oscillator tuning word OTW at the end of each sawtooth ramp (chirp). Subtracting the sampled tuning word $OTW_{\alpha_2 SMP}$ compensates the oscillator tuning word OTW of Equation 2 so that when the sawtooth ramp transitions from its value $OTW_{end}$ to the value $OTW_{start}$, the output of the phase detector should not be disturbed.

Although FIG. 4 shows a realization of a digital loop filter DLF 106, other configurations are possible. For instance, the DLF 106 can be a loop filter with both digital components and analog components. Also, the oscillator tuning word OTW provided by the summer 410 can first be applied to a D/A converter and then the output of the D/A converter can be applied to an oscillator such as a VCO.

Figure 5:
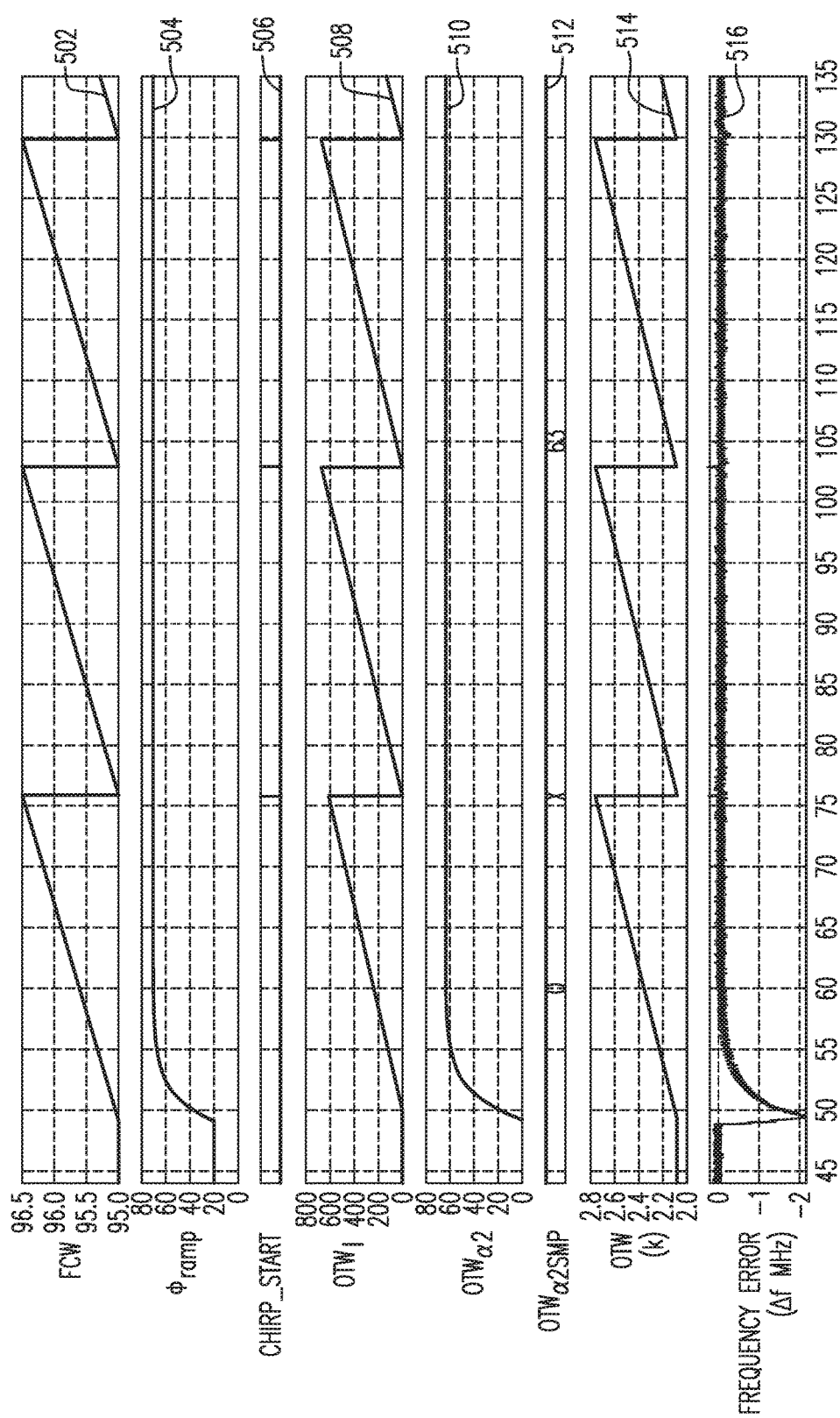
FIG. 5 shows simulated plots of internal phased locked loop signals of a DPLL that includes the DLF of FIG. 4.

FIG. 5 shows simulated plots of internal phased locked loop signals of the DPLL 100 of FIG. 1, in which the DLF is implemented by the DLF 401 of FIG. 4. FIG. 5 illustrates advantages of using the above fast-settling ramp generation method. A first curve 502 shows the frequency command word FCW as a sawtooth ramp, which is periodic as a function of time. A second curve 504 shows the phase error Φramp, which attains a constant value consistent with the DPLL 100 of FIG. 1 operating with a ramp input. In accordance with DPLL system theory, the phase error Φramp maintains a relatively constant value during subsequent sawtooth ramps (chirps).

A third curve 506 shows the ramp reset signal chirp_start where the non-zero periodic pulses are provided to signal at the start of a new sawtooth ramp. As described above with respect to the DLF 401 of FIG. 4, on each non-zero pulse, the accumulator 414 in the PI filter can be reset. This can, in turn, cause the oscillator tuning word integral part $OTW_I$ to reset as shown in a fourth curve 508.

Additionally, on each non-zero periodic pulse of the ramp reset signal chirp_start, the tuning word proportional part $OTW_{\alpha_2}$, as shown by firth curve 510, is sampled so that the memory element 416 can provide the sampled tuning word $OTW_{\alpha_2 SMP}$, as shown by a sixth curve 512. The oscillator tuning word proportional part $OTW_{\alpha_2}$ follows the phase error and is sampled at the start of every sawtooth ramp (chirp). A seventh curve 514 shows the oscillator tuning word OTW as provided at the output of the summer 410 of FIG. 4. Finally, an eighth curve 516 of the frequency error Δf is also shown.

As shown in curves 514 and 502 of FIG. 5, the initial frequency error Δf is relatively large (greater than 2 MHz) and corresponds to about 7 microseconds (us) of settling time. However, subsequent sawtooth ramps (chirps) give rise to much smaller errors and reduced settling time on the order of 1 us. During the first sawtooth ramp, the DLF 106 of the DPLL 100 has not yet had a chance to acquire the target phase error required to generate the ramp. Following the first ramp and on each reset signal chirp_start, the curves 504 and 510 indicate that the phase error $\Phi_{ramp}$ and the oscillator tuning word proportional part $OTW_{\alpha_2}$ attain stable steady state values. Once this occurs, the DLF 106 compensates the DPLL 100 so that frequency error Δf of curve 514 becomes close to zero or almost zero.

Figure 6:
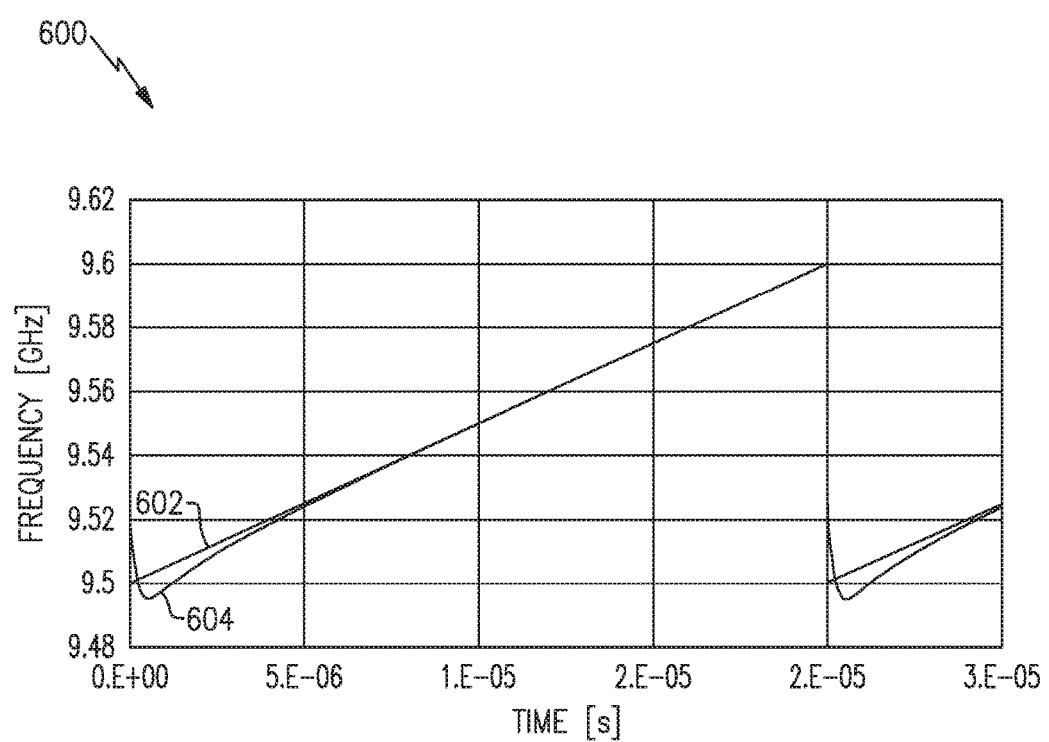
FIG. 6 compares a plot of a measured sawtooth ramp generated by a DPLL that includes a DLF of FIG. 4 to a plot of a measured sawtooth ramp generated by a DPLL that includes a different DLF.

FIG. 6 compares a curve 602 corresponding to a measured sawtooth ramp generated by a DPLL that includes a DLF of FIG. 4 with a curve 604 of a measured sawtooth ramp generated by a DPLL that includes a conventional DLF. The generated ramp has a bandwidth BW of 100 MHz and ramps from 9.5 GHz to 9.6 GHz in 20 us. The settling time is greatly reduced for a DPLL with the DPL 401 of FIG. 4 as shown by the curve 602.

Figure 7:
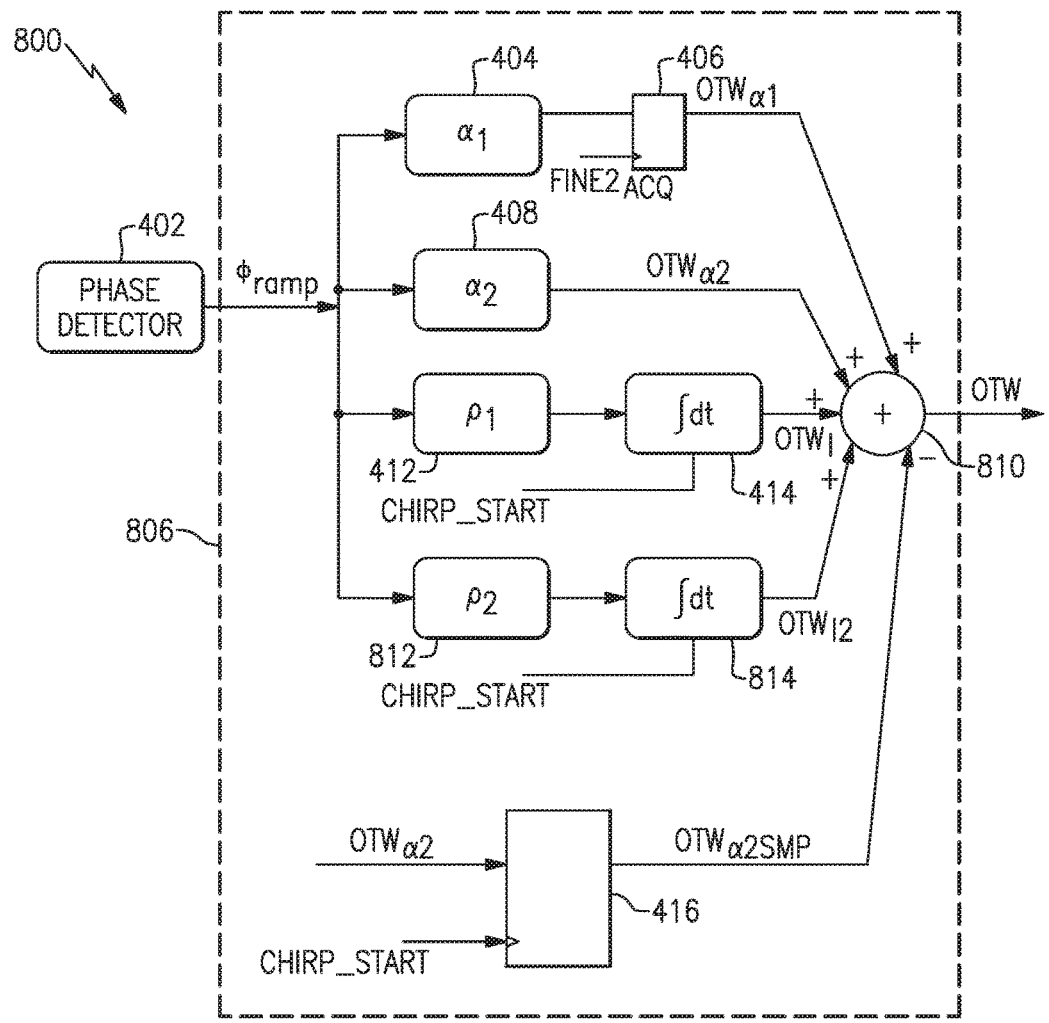
FIG. 7 is a schematic block diagram of a portion of a DPLL configured to provide an oscillator tuning word OTW according to another embodiment.

Although FIG. 4 related to a DPLL that includes a DLF 401 configured as a PI filter having an integral path with accumulator 414 and a proportional path having a proportional block 408, other configurations are possible. For instance, a DPLL can be a different order or different type (I, II, III, IV, or higher). In some configurations, the proportional path having the proportional block 404 and the digital memory element 406 can be removed. In some other configurations, greater or fewer proportional paths and/or integral paths having accumulators can implemented. FIG. 7 illustrates an example of an additional embodiment where greater or fewer proportional and/or integral paths are included with compensating elements. The loop filters shown in FIG. 7 can implement the DLF 106 of FIG. 1, for example. Any suitable combination of features of the DLFs of FIGS. 4, and/or 7 can be implemented together with each other.

FIG. 7 is a schematic block diagram of a portion 800 of a DPLL configured to provide an oscillator tuning word OTW according to another embodiment. The portion 800 of the DPLL includes a DLF 806 and the phase detector 402. The DLF 806 is similar to the DLF 401 of FIG. 4, except it includes an additional integral path having an integral coefficient block 812 and an accumulator 814. The summer 410 of FIG. 4 is also replaced by the summer 810 having an additional input. As shown in FIG. 7, the accumulator 814 provides an additional oscillator tuning word integral part $OTW_{I2}$ to the summer 810. To compensate the oscillator tuning word OTW at the start of a sawtooth ramp, the accumulator 814, like the accumulator 414, receives the ramp reset signal $chirp_{start}$. This can, in turn, reset the oscillator tuning word integral part $OTW_{I2}$ at the start of each sawtooth ramp.

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Some of the embodiments described above have provided examples in connection with DPLLs. However, any suitable principles and advantages of the embodiments can be applied to charge pump PLLs as appropriate. More generally, any of the principles and advantages discussed herein can be implemented in connection with any other systems, apparatus, or methods that benefit could from any of the teachings herein. For instance, any of the principles and advantages discussed herein can be implemented in connection with any devices with a need for a reduced settling time of a sawtooth ramp signal.

Aspects of this disclosure can be implemented in various electronic devices. For instance, one or more of the above DPLLs implemented in accordance with any of the principles and advantages discussed herein can be included in various electronic devices. Examples of the electronic devices can include, but are not limited to, radar systems, radar detectors, consumer electronic products, parts of the consumer electronic products such as semiconductor die and/or packaged modules, electronic test equipment, wireless communication devices, etc. Examples of the electronic devices can also include communication networks. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A phase-locked loop comprising:
an input configured to receive a frequency command word, wherein the frequency command word is an input sawtooth ramp signal;
a loop filter configured to provide a sawtooth ramp signal, wherein the sawtooth ramp signal is periodic and based on the frequency command word, wherein the sawtooth ramp signal has a settling time associated with a transition from a first ramping portion of a first period of the sawtooth ramp signal to a second ramping portion of a second period of the sawtooth ramp signal, and wherein the settling time is less than 1 microsecond; and
an oscillator coupled to the loop filter, the oscillator configured to generate an oscillating signal based on the sawtooth ramp signal.

2. The phase-locked loop of claim 1, wherein the oscillator is a digitally controlled oscillator and the sawtooth ramp signal represents an oscillator tuning word.

3. The phase-locked loop of claim 1, further comprising a time-to-digital converter coupled in a feedback path between an output of the oscillator and an input of the loop filter.

4. The phase-locked loop of claim 1, wherein the phase-locked loop is a type II phase-locked loop.

5. The phase-locked loop of claim 1, wherein the loop filter comprises a proportional path and a sampling circuit configured to sample a value from the proportional path, and the sawtooth ramp signal is based on an output of the proportional path and an output of the sampling circuit.

6. The phase-locked loop of claim 5, wherein the loop filter further comprises an integral path configured to reset responsive to a signal indicating a new chirp of the sawtooth ramp signal, and wherein the sawtooth ramp signal is based on an output of the integral path.

7. The phase-locked loop of claim 6, wherein the loop filter further comprises another proportional path that is inactive after the phase-locked loop is locked.

8. A radar device comprising the phase-locked loop of claim 1.

9. A phase-locked loop comprising:
a loop filter comprising a proportional path and a sampling circuit configured to sample a value from the proportional path, wherein the loop filter is configured to provide a sawtooth ramp signal based on an output of the sampling circuit and an output of the proportional path, wherein the sawtooth ramp signal is periodic; and
an oscillator coupled to the loop filter, the oscillator configured to generate an oscillating signal based on the sawtooth ramp signal.

10. The phase-locked loop of claim 9, wherein the loop filter is configured to bring the sawtooth ramp signal to an initial value in association with an end of a chirp to thereby reduce settling time of the sawtooth ramp signal.

11. The phase-locked loop of claim 9, wherein the sampling circuit is configured to sample the value from the proportional path responsive to a signal indicating a new chirp of the sawtooth ramp signal.

12. The phase-locked loop of claim 9, wherein the loop filter further comprises an integral path including an accumulator configured to reset responsive a signal indicating a new chirp of the sawtooth ramp.

13. The phase-locked loop of claim 9, wherein the loop filter comprises a summer configured to subtract the output of the sampling circuit from a value that includes the output of the proportional path to generate the sawtooth ramp signal.

14. The phase-locked loop of claim 9, wherein the sawtooth ramp signal has a settling time of less than 100 cycles of a reference clock signal provided to the phase-locked loop.

15. The phase-locked loop of claim 9, wherein the loop filter further comprises another proportional path configured to be active during an acquisition mode of the phase-locked loop.

16. The phase-locked loop of claim 9, wherein the oscillator comprises a digitally controlled oscillator, wherein the sawtooth ramp signal is an output tuning word for the digitally controlled oscillator.

17. A method of generating a sawtooth ramp signal in a phase-locked loop, the method comprising:
   sampling a signal from a loop filter of the phase-locked loop; and
   adjusting an output of the loop filter based on a value from said sampling such that the output of the loop filter is the sawtooth ramp signal with a reduced settling time, wherein the sawtooth ramp signal is a periodic signal.

18. The method of claim 17, further comprising resetting an accumulator of the loop filter responsive to a chirp start signal indicating a start of a chirp of the sawtooth ramp signal, wherein said sampling is performed with a sampling circuit that comprises a digital memory element.

19. The method of claim 17, wherein said adjusting brings the output of the loop filter to an initial value in association with an end of a chirp.

20. The method of claim 17, wherein the sawtooth ramp signal has a settling time of less than 1 microsecond.

* * * * *